United States Patent [19]

Howley

[11] Patent Number: 5,128,609
[45] Date of Patent: Jul. 7, 1992

[54] SETTING UP OF QUADRATURE SIGNALS

[75] Inventor: Colin K. Howley, Stonehouse, United Kingdom

[73] Assignee: Renishaw plc, Gloucestershire, United Kingdom

[21] Appl. No.: 474,018

[22] PCT Filed: Sep. 4, 1989

[86] PCT No.: PCT/GB89/01029
§ 371 Date: Apr. 26, 1990
§ 102(e) Date: Apr. 26, 1990

[87] PCT Pub. No.: WO90/02956
PCT Pub. Date: Mar. 22, 1990

[30] Foreign Application Priority Data

Sep. 2, 1988 [GB] United Kingdom ............... 8820778

[51] Int. Cl.⁵ .................. G01R 13/20; G01R 13/28
[52] U.S. Cl. .................. 324/121 R; 324/83 Q; 324/88; 340/743
[58] Field of Search ........... 324/121 R, 81, 88, 83 Q; 340/723, 732, 789, 743; 364/521

[56] References Cited

U.S. PATENT DOCUMENTS

| | | | |
|---|---|---|---|
| 3,305,843 | 2/1967 | Scuitto | 340/743 |
| 3,476,974 | 11/1969 | Turnage, Jr. et al. | 340/743 |
| 3,484,684 | 12/1969 | Lipscombe | 324/88 |
| 3,582,773 | 6/1971 | Karl | 324/88 |
| 3,746,912 | 7/1973 | Redecker et al. | 340/743 |
| 3,789,200 | 1/1974 | Childress et al. | 340/747 |
| 4,041,254 | 8/1977 | Bradley et al. | 324/121 R |
| 4,149,155 | 4/1979 | Kishi | 340/524 |
| 4,405,895 | 9/1983 | Girst et al. | 324/83 Q |
| 4,459,543 | 7/1984 | McNeill | 324/83 Q |
| 4,631,533 | 12/1986 | Mark, Jr. | 340/743 |
| 4,648,113 | 3/1987 | Horn | 324/88 |
| 4,680,620 | 7/1987 | Baker et al. | 324/88 |

FOREIGN PATENT DOCUMENTS 274841 7/1988 European Pat. Off.

OTHER PUBLICATIONS

Kuz'minskii et al "Device for Adjustment of precision Motion Transducers", Instruments & Experimental Techniques, vol. 30, No. 6 Part 2, Nov./Dec. 1987 pp. 1497-1499.
Bergmann, "Elektrische Messtechnik" 1981, pp. 133-134 The Radio Amateur's Handbook, 1981, 58th Ed. pp. 4-61.
"A Versatile Phase Meter" by Patchett et al. Electronic Engineering, May 1952, pp. 224-229.

Primary Examiner—Kenneth A. Wieder
Assistant Examiner—William J. Burns
Attorney, Agent, or Firm—Spencer, Frank & Schneider

[57] ABSTRACT

A device to assist in setting up the pitch, roll, yaw and standoff of a read head relative to a scale, so as to improve the quadrature relationship of its outputs. Two superimposed Lissajous figures are produced on an oscilloscope screen. One of these figures is a rotation or reflection of the other. The read head is adjusted until the Lissajous figures coincide. Simpler, less accurate arrangements are also described, in which a variable DC output signal is produced which represents the radius of a hypothetical Lissajous derivable from the signals. The read head is then adjusted to give a constant DC output, representing a constant Lissajous radius.

11 Claims, 3 Drawing Sheets

SETTING UP OF QUADRATURE SIGNALS

BACKGROUND OF THE INVENTION

This invention relates to methods and apparatus to assist in the setting up of devices which produce output signals in quadrature, for example so as to ensure that the output signals are accurately in a 90° phase relationship, or accurately of the same amplitude, or accurately with zero DC offsets.

Such a method and apparatus are useful in setting up a scale and readhead, such as used on co-ordinate measuring machines or machine tools, to determine the position of a movable part of such a machine relative to a fixed part. It is well known to provide such scales and readheads wherein the readhead has two outputs in quadrature. These outputs can be fed to further circuitry for counting the cycles of the incoming signals so as to determine position, for determining the direction of movement by determining which of the quadrature signals leads the other, and/or for providing position interpolation within one cycle of the output. Of course, it is desirable that the readhead should be set up correctly aligned relative to the scale such that the outputs are accurately in quadrature, with a 90° phase shift, the same amplitudes and with zero DC offsets. Particularly in the case where the signals are to be fed to an interpolator, this can affect the accuracy of the resulting determination of the relative position.

An example of a scale and readhead providing quadrature outputs to an interpolator is shown in European Patent Application No. EP-0274841-A.

One way to determine such factors would be to feed the two quadrature signals to the X and Y inputs of an oscilloscope. This produces a Lissajous figure, which should be a perfect circle centred on zero if all of the above factors are correctly set up. The mechanical position of the readhead relative to the scale can be adjusted to achieve this. However, it is very difficult to judge whether the Lissajous figure observed is perfect. The results also depend upon the accuracy of calibration of the oscilloscope, for example ensuring that the gains of its X and Y channels are exactly matched and that neither introduces a DC offset.

SUMMARY OF THE INVENTION

One aspect of the present invention provides a method of setting up a device which provides two signals in quadrature, comprising:

processing said quadrature signals in a processing circuit which has at least one output line, said processing circuit including means for combining the quadrature signals, to give at least one combined output signal on said at least one output line, representative of the alignment of the quadrature signals;

passing said at least one combined output signal to a display device and displaying an indication of said alignment of the quadrature signals; and adjusting said device which provides the quadrature signals to improve the indicated alignment.

A second aspect of the present invention provides a method of setting up a device which provides two signals in quadrature, comprising producing on an oscilloscope screen two superimposed Lissajous figures derived from the quadrature signals, one of the Lissajous figures being a rotation or reflection of the other, and adjusting the device so as to improve the co-incidence of the Lissajous figures.

Further aspects of the invention provide apparatus for use in performing the above methods.

BRIEF DESCRIPTION OF THE DRAWINGS

Preferred embodiments of the invention will now be described by way of example, with reference to the accompanying drawings, wherein.

DESCRIPTION OF THE PREFERRED EMBODIMENTS

Figure 1:
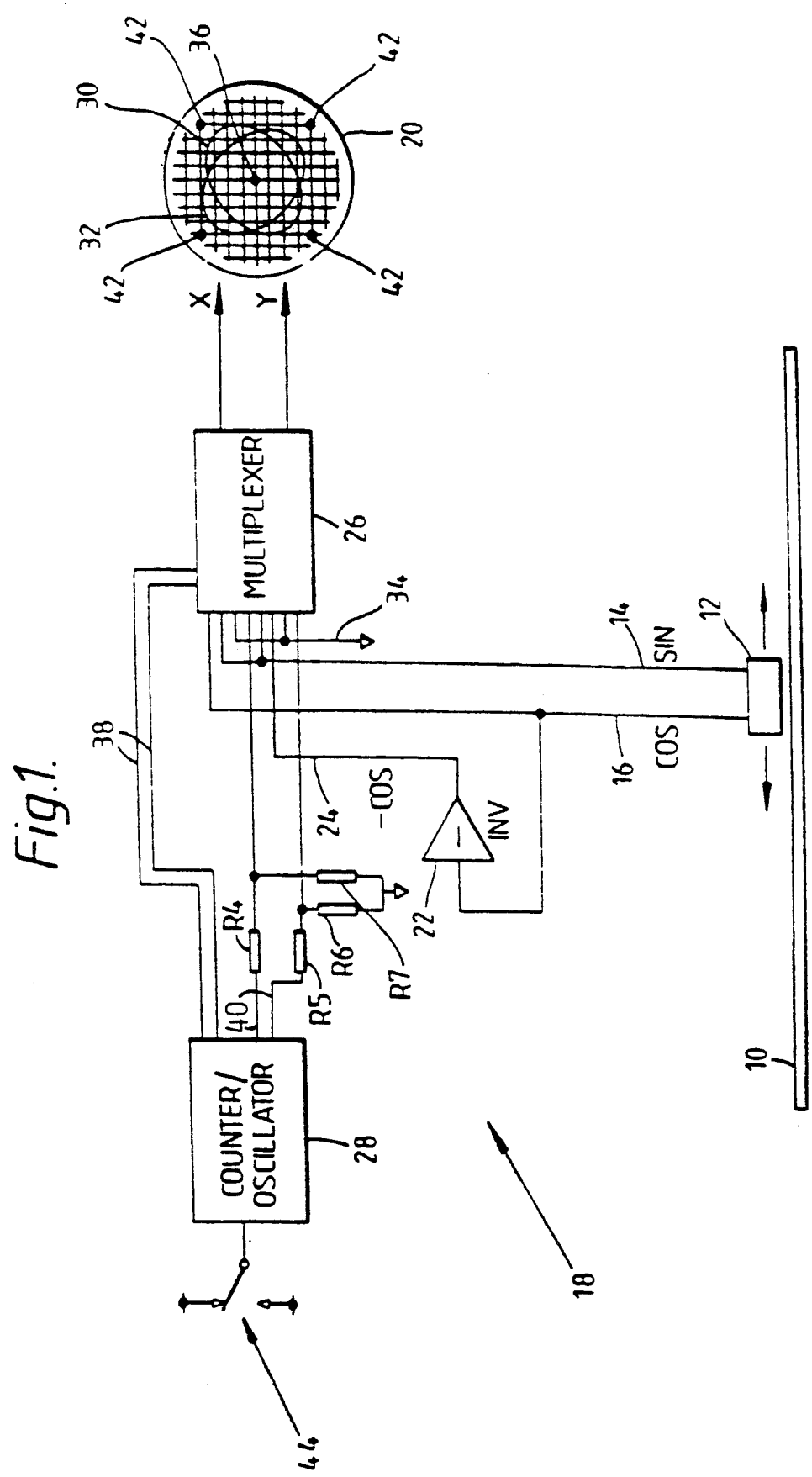
FIG. 1 is a block schematic diagram of a first embodiment, connected to a scale and readhead.

Referring to FIG. 1, there is a scale 10 along which a readhead 12 can be traversed, producing SIN and COS outputs 14, 16 which are (at least nominally) in quadrature. When installing the scale 10 and readhead 12 on a machine such as a co-ordinate measuring machine or machine tool, it is required to adjust their relative alignments so as to give outputs 14, 16 which are accurately at 90° to each other, with the same amplitudes and each with zero DC offsets. This is done by adjusting the roll, pitch, yaw and standoff between the readhead and the scale.

To assist such alignment, the outputs 14, 16 of the readhead 12 are taken via circuitry 18 to the X and Y inputs of an oscilloscope 20.

The circuity 18 includes an inverter 22 which produces a signal —COS on a line 24 which is an inverted version of the COS signal 16.

These signals are fed to the oscilloscope 20, as described below, via a multiplexer 26. The multiplexer 26 is driven by a continuously cycling counter/oscillator 28, and has two channels, one feeding the X input of the oscilloscope and one feeding the Y input. Each channel has four inputs which are connected in turn to the respective oscilloscope input. The rate at which this multiplexing takes place is controlled by two binary output lines 38 of the counter/oscillator 28, giving the necessary four time slices.

In a first time slice, the COS signal 16 is fed to the X input of the oscilloscope and the SIN signal 14 is fed to the Y input. This produces a first Lissajous FIG. 30 on the screen of the oscilloscope (assuming the readhead to be moving relative to the scale; if it is stationary a single dot is produced). During a second time slice, the multiplexer 26 connects the SIN signal 14 to the X input of the oscilloscope, and the —COS signal 24 to the Y input. This produces a second Lissajous FIG. 32 on the oscilloscope screen. With the inputs as just described, it can be shown that the second Lissajous FIG. 32 is the same as the first Lissajous FIG. 30, but rotated through 90°. Alternatively, the second Lissajous FIG. 32 can be considered as being derived from the first by reflecting the first Lissajous FIG. 30 twice, firstly about a 45° axis and secondly about a vertical axis. These two alternative transformations from the first Lissajous FIG. 30 to the second Lissajous FIG. 32 can be shown to be theoretically equivalent.

The frequency of the counter/oscillator 28 is sufficiently high that the time slices are indistinguishable to the naked eye on the oscilloscope screen, so that the two Lissajous figures appear superimposed on top of each other as shown.

If the readhead is perfectly aligned relative to the scale 10, then both the two Lissajous figures will be perfect circles, centered on zero, and co-incident with each other. If the alignment is not correct, then this perfect situation will not be the case. It is an easy matter for the user to adjust the alignment (roll, pitch, yaw and standoff) until the two Lissajous figures are co-incident. This is done by moving the readhead along the scale, while observing the oscilloscope, adusting the alignment, then repeating the process as necessary.

An advantage of this technique is that no reliance is placed upon the accuracy of calibration of the oscilloscope 20. If the oscilloscope 20 itself introduces mismatches of gain between the two channels, or DC offsets, then the resulting Lissajous figures will no longer be perfect circles centred on zero. Nevertheless, all the user has to do is align the readhead relative to the scales such that the (imperfect) Lissajous figures are co-incident with each other, and he can then be confident that the alignment is correct, and that the imperfections are introduced by the oscilloscope and not by misalignment of the readhead.

The discussion above has assumed that the output signals 14,16 from the read head 12 are sinusoidal. However, it is a further advantage of the present technique that it also works with symmetrical non-sinusoidal signals. e.g. triangular or square signals in quadrature. The Lissajous figures will no longer be circles or ellipses, but it is still easy to align the read head so that they coincide.

The block schematic diagram also shows certain features which, while not essential, are of assistance during the setting up procedure.

For example, the multiplexer has a third time slice during which it connects both X and Y inputs of the oscilloscope to zero volts (line 34). This produces a dot 36 at the centre of the oscilloscope screen, superimposed on the Lissajous figures. If the oscilloscope is introducing gross DC offsets in one or both channels, the user can easily adjust it so as to centre the dot 36. However, it is not essential to do this accurately.

Secondly, in addition to the binary outputs 38 which control the multiplexer 26 and cause it to cycle through its four time slices, the counter/oscillator 28 may have two further binary outputs 40. These are taken from less significant bits of the binary outputs of the counter, and thus are at a higher frequency than the outputs 38. Thus, the two binary outputs 40 can cycle through all four possible binary values during the fourth time slice of the multiplexer 26 (and indeed may do so more than once). During the fourth time slice, the two outputs 40 are respectively connected to the X and Y inputs of the oscilloscope, via respective voltage dividers R4, R7 and R5,R6. These voltage dividers provide positive and negative reference voltages (as the outputs 40 of the counter switch between positive and negative values). The X and Y inputs of the oscilloscope oscillate between these positive and negative values (one at twice the rate of the other) during the fourth time slice. The result is to produce four dots 42, which if the oscilloscope gain is correctly set will be at the four corners of a square filling the majority of the oscilloscope screen. This assists the user to set up the gains of the two oscilloscope channels to appropriate values. Again, it is not essential that they should be absolutely correct or absolutely matched. The values of the resistors R4,R7,R5, R6 are chosen such that the dots 42 represent the maximum amplitudes delivered on the lines 14 and 16 when the readheads are saturated. This makes it easy for the user to see that he is getting a good signal level from each of the outputs of the readhead, without going over the saturation limits (which would result in distortion of the resorting COS and SIN waveforms).

An optional switch 44 may be provided to inhibit the counter/oscillator 28 and force it to produce a zero output. The multiplexer 26 then is constrained to feed the SIN and COS outputs 14, 16 directly through to the X and Y inputs of the oscilloscope 20, thereby producing a conventional Lissajous figure for monitoring purposes.

In the example described, the Lissajous FIG. 32 is rotated 90°, compared with the Lissajous FIG. 30. However, although this is the preferred embodiment, it is not the only way of producing useful results. The Lissajous FIG. 30 may be rotated through other angles, or may simply be reflected about an axis. For example, in another embodiment (not shown), during the first time slice of the multiplexer 26 the COS signal 16 is fed to the X input of the oscilloscope and the SIN signal 14 is fed to the Y input, as in the embodiment described above. In the second time slice, however, these signals are simply reversed, with the SIN signal 14 being fed to the X input and the COS signal 16 to the Y input. With such an arrangement, the second Lissajous FIG. 32 is simply a reflection about a 45° axis of the first Lissajous FIG. 30. In a further modification of this arrangement, the SIN and COS signals fed to the multiplexer for the first time slice are DC coupled to the multiplexer, so that the Lissajous figure is subject to DC offsets, while the SIN and COS signals fed for the second time slice are AC coupled so as to remove such DC offsets. This has the advantage that once the readhead 12 has been aligned such that the Lissajous figures are co-incident, it follows that any DC offsets must have been removed. Of course, such AC coupling is not necessary in the preferred embodiment as described above.

Figure 2:
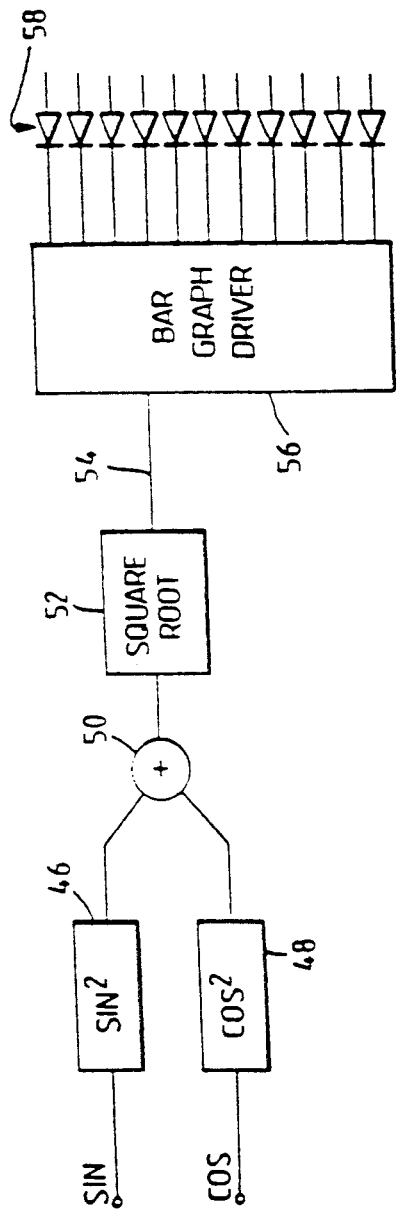
FIGS. 2 and 3 are circuit diagrams of two further embodiments.

FIG. 2 shows a device which is simpler to use than that of FIG. 1, since it provides a quick indication of whether the sine and cosine signals SIN and COS from the readhead are correctly set up. However, the indication given is not as accurate as the embodiment of FIG. 1, so this embodiment primarily finds use in lower accuracy applications where ease of set up is of prime importance.

If one considers the hypothetical Lissajous figure which would be produced by feeding the SIN and COS signals to the X and Y inputs of an oscilloscope, for example the Lissajous FIG. 30 shown in FIG. 1, it can be seen that the radius of the Lissajous figure from the origin 36 will be constant throughout the cycle of the incoming waveforms, when the inputs are correctly adjusted. The circuit of FIG. 2 is designed to give a simple indication corresponding to the radius of the Lissajous.

For this purpose, the inputs SIN and COS are taken to respective analogue squaring circuits 46,48 which produce signals $SIN^2$ and $COS^2$. These are added together in an adder 50, and the square root of the result is then taken by a circuit 52. The resulting signal on a line 54 is proportional to the magnitude of the radius of the hypothetical Lissajous figure discussed above. This is taken to a standard integrated circuit bar graph driver 56, which, at any instant of time, lights one of a series of light emitting diodes (LEDs) 58 correponding to the magnitude of the signal 54. Thus, at any instant, one of the LEDs 58 will be lit, corresponding to the instantaneous magnitude of the radius.

In use, the readhead 12 is driven along the scale 10 so as to produce the sinusoidal inputs SIN and COS. If these inputs are accurately in quadrature, accurately at 90° phase separation, and with no DC offsets, then the radius signal 54 will be a constant DC level, and only one of the LEDs 58 will light up during the movement of the readhead 12. However, where the alignment is not accurate, the signal 54 will not be constant, but will have superimposed upon it an oscillation at the frequency of the input signals. Over a cycle of the input signals, therefore, several of the LEDs 58 will light up, and at normal speeds of movement of the readhead 12 they will appear to be lit simultaneously.

Adjustment of the scale/readhead alignment, therefore, is as follows. Firstly, the standoff of the readhead from the scale is adjusted so as to get a strong DC signal 54 (indicated by the lighting of a LED 58 which is relatively high in the series of LEDs). This is done with the readhead stationary. The lower value LEDs in the series 58 may be coloured red, and the rest green, so as to indicate when the DC level of the signle 54 is adequate. Then, the readhead is moved, and (assuming misalignment) several of the LEDs 58 will light simultaneously as described above. The roll, pitch and yaw of the readhead are adjusted to reduce this, and the process is repeated until satisfactory results are obtained.

Figure 3:
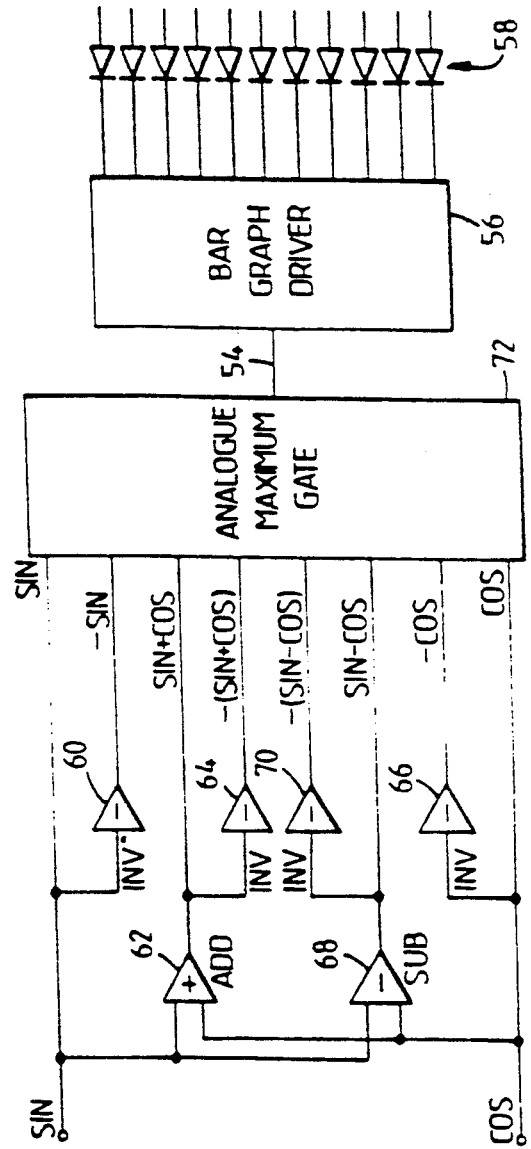

Although the embodiment of FIG. 2 is simpler to use than that of FIG. 1, its disadvantage is that the circuits 46,48 and 52 are quite complex, and therefore expensive to implement. FIG. 3 therefore shows a simpler circuit which performs the same job.

FIG. 3 has a bar graph driver 56 and a series of LEDs 58, as in FIG. 2. The difference lies in the circuits used to produce the signal 54 which represents the radius of the hypothetical Lissajous figure.

In FIG. 3, the inputs SIN and COS are taken to a number of inverters, adders and subtractors, 60 to 70, which perform various inversions and combinations of the SIN and COS signals. The resulting signals are taken, with the original SIN and COS signals, to an analogue gate 72, which serves to select whichever of its inputs is at the most positive value at any given instant, and to pass that signal through to the output line 54 and on to the bar graph driver 56.

Specifically, a −SIN signal is produced by inverting the SIN signal in an inverter 60. A signal SIN+COS is produced by adding the SIN and COS signals in an adder 62. The adder 62 scales the signal by a factor 0.7, so that it has the same nominal amplitude as the inputs SIN and COS. An inverted version −(SIN+COS) is produced by an inverter 64. A signal −COS is produced from the COS signal by an inverter 66. A signal SIN−COS is produced by subtraction in a substractor 68, which again scales the signal by 0.7. A signal −(SIN−COS) is produced from this by inversion in an inverter 70.

Figure 4:
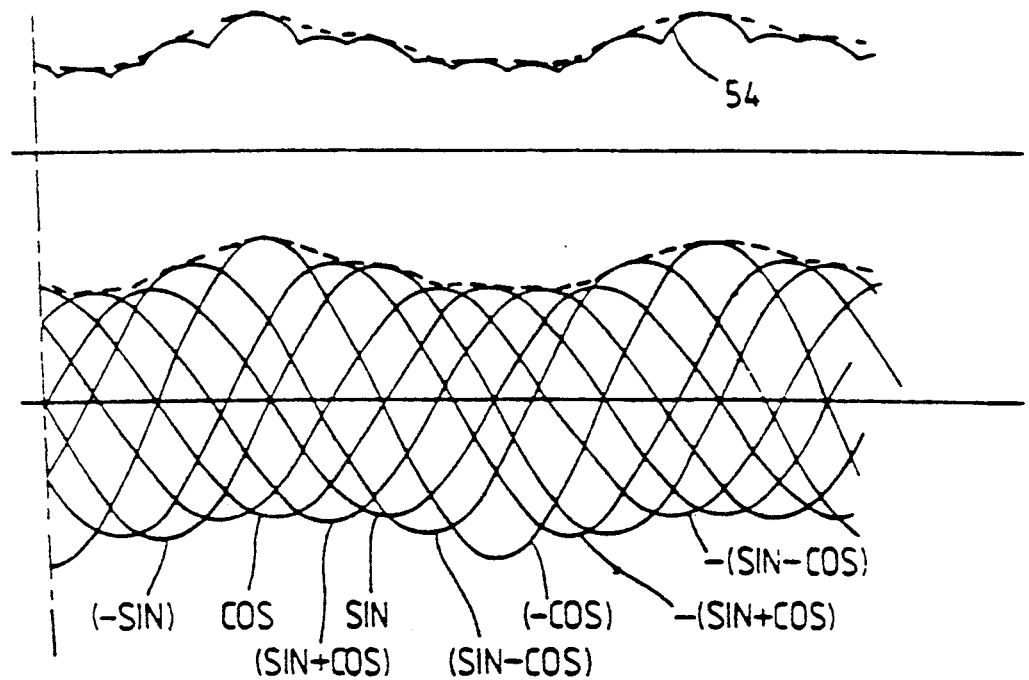
FIG. 4 is a waveform diagram for the circuit of FIG. 3.

The various signals which are input to the gate 72 are shown in FIG. 4, and it will be seen that each is phase shifted relative to the original SIN and COS signals. If the original SIN and COS signals resulted from a perfectly aligned readhead 12, then each of these signals would have the same amplitude, but any inaccuracies in the phase separation, amplitudes or DC levels of the incoming SIN and COS signals will result in the various inputs to the gate 72 having different amplitudes.

The effect of the gate 72, which always selects the most positive of the incoming signals, is shown by the signal 54 in FIG. 4. If all the input signals have the same amplitude, then the signal 54 is subject only to minor fluctuations between the peak of one input signal and the next. However, if the incoming signals to the gate 72 have different amplitudes, a larger variation is superimposed on top of these minor fluctuations, as shown by broken lines in FIG. 4. This larger variation corresponds to the variation in the radius of the hypothetical Lissajous, as with the FIG. 2 embodiment, and is caused by the original SIN and COS signals having differing amplitudes, or DC offsets, or non-90° separation.

The result, when the signal 54 is fed to the bar graph driver 56, is that if the input signals to the gate 72 all have the same amplitude, then only one of the LEDs 58 (or at most two) will be lit, because the minor fluctuations in the signal 54 are less than the difference between two adjacent thresholds within the bar graph driver. However, if the input signals to the gate have different amplitudes, then several different LEDs in the series 58 will light up, at different parts of the cycle. As the readhead is driven along the scale 10, these different LEDs appear to light simultaneously.

The method of use of the circuit of FIG. 3 is therefore the same as that of FIG. 2. After adjusting the standoff to give a good DC level for the signal 54, the readhead 12 is moved over the scale. Normally several LEDs 58 will light. The readhead is now adjusted, and the procedure repeated until only one or two LEDs remain alight as the readhead moves.

I claim:

1. A method of setting up a device which provides two signals in quadrature, comprising producing on an oscilloscope screen two superimposed Lissajous figures derived from the quadrature signals, one of the Lissajous figures being a rotation or reflection of the other, and adjusting the device so as to improve the co-incidence of the Lissajous figures.

2. Apparatus for setting up a device which provides two signals in quadrature, comprising a processing circuit having two input lines for receiving the quadrature signals and two output lines for connection to X and Y inputs respectively of an oscilloscope, the processing circuit including means for combining the quadrature signals to produce two combined output signals, one on each of the output lines, the combination being such as to produce two superimposed Lissajous figures derived from the quadrature signals on a screen of an oscilloscope when connected to the output lines, one of the Lissajous figures being a rotation or reflection of the other.

3. Apparatus according to claim 2, wherein the combining means has means for feeding the quadrature signals to the output lines in at least two separate time slices, thereby producing said two superimposed Lissajous figures.

4. Apparatus according to claim 3, including means for inverting one of the quadrature signals in one of the time slices.

5. Apparatus according to claim 3, including means for feeding DC levels to the output lines in at least one further time slice, thereby producing at least one reference dot on the oscilloscope screen.

6. Apparatus according to claim 5, wherein said DC levels are zero.

7. Apparatus according to claim 5, wherein said DC levels represent saturation levels of the quadrature signals.

8. Apparatus according to claim 4, including means for feeding DC levels to the output lines in at least one further time slice, thereby producing at least one reference dot on the oscilloscope screen.

9. A method of setting up a device which provides two signals in quadrature, comprising:

processing said quadrature signals in a processing circuit which has two output lines, said processing circuit including means for combining said quadrature signals to produce two combined output signals on said at least two output lines, said output signals being representative of the alignment of the quadrature signals;

passing said two combined output signals to X and Y inputs of an oscilloscope having a screen, two superimposed Lissajous figures derived from said quadrature signals and representative of the alignment thereof being displayed on said screen, one of said Lissajous figures being a rotation or reflection of the other; and adjusting said device which provides the quadrature signals to improve the coincidence of said Lissajous figures.

10. Apparatus for setting up a device which provides two signals in quadrature, comprising:

a processing circuit, having two input lines for receiving the quadrature signals and an output line, the processing circuit including means for combining the quadrature signals to produce an output signal representing the radius of a hypothetical Lissajous figure derivable from the quadrature signals, said combining means including a plurality of circuit means for producing respective different phase-shifted inversions and/or combinations of the quadrature signals; and an analogue gate means for selecting whichever of the outputs of said circuit means is the highest; and a display device connected to said output line for receiving said output signal and producing therefrom an indication of the alignment of the quadrature signals, said selected output being passed to said display device.

11. Apparatus according to claim 10, wherein the display device comprises a bar graph driver.

* * * * *